(12) United States Patent
Miyawaki et al.

(10) Patent No.: US 8,772,912 B2
(45) Date of Patent: Jul. 8, 2014

(54) ELECTRONIC DEVICE

(75) Inventors: Shotaro Miyawaki, Nukata-gun (JP); Katsuhiko Kawashima, Nukata-gun (JP); Atsushi Kashiwazaki, Anjo (JP); Takashi Yoshimizu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/974,166

(22) Filed: Dec. 21, 2010

(65) Prior Publication Data

US 2011/0180915 A1 Jul. 28, 2011

(30) Foreign Application Priority Data

Jan. 26, 2010 (JP) ................................. 2010-014663

(51) Int. Cl.
| | | |
|---|---|---|
| *H01L 23/495* | (2006.01) | |
| *H01L 21/50* | (2006.01) | |
| *H01L 23/31* | (2006.01) | |
| *H01L 23/00* | (2006.01) | |
| *H01L 23/433* | (2006.01) | |

(52) U.S. Cl.
CPC ... *H01L 23/3121* (2013.01); *H01L 2224/48247* (2013.01); *H01L 23/49531* (2013.01); *H01L 23/562* (2013.01); *H01L 23/49541* (2013.01); *H01L 23/4334* (2013.01)
USPC .............. 257/675; 257/E21.499; 257/E23.03; 257/705; 257/787; 257/775; 438/123; 438/127

(58) Field of Classification Search
USPC ............ 257/675, E21.499, E23.03, 750, 100, 257/433, 787, 775; 438/123, 127
See application file for complete search history.

(56) References Cited

U.S. PATENT DOCUMENTS

| | | | |
|---|---|---|---|
| 2,961,642 A | 12/1998 | Oka et al. | |
| 6,069,023 A * | 5/2000 | Bernier et al. | ................. 438/107 |
| 6,257,215 B1 | 7/2001 | Kaminaga et al. | |
| 6,339,252 B1* | 1/2002 | Niones et al. | .................. 257/666 |
| 2003/0099836 A1* | 5/2003 | Gandi et al. | .................. 428/408 |
| 2008/0170372 A1 | 7/2008 | Kirigaya | |
| 2009/0011548 A1* | 1/2009 | Iimura et al. | ................... 438/123 |
| 2011/0169037 A1* | 7/2011 | Hasegawa et al. | .............. 257/98 |

FOREIGN PATENT DOCUMENTS

| | | |
|---|---|---|
| JP | A-07-273248 | 10/1995 |
| JP | A-10-056126 | 2/1998 |
| JP | B2-3201277 | 4/1998 |
| JP | A-2002-026219 | 1/2002 |
| JP | A-2006-179538 | 7/2006 |

OTHER PUBLICATIONS

Office Action mailed Mar. 6, 2012 in corresponding JP Application No. 2010-014663 (and English translation).

* cited by examiner

*Primary Examiner* — Cathy N Lam

(74) *Attorney, Agent, or Firm* — Posz Law Group, PLC

(57) ABSTRACT

An electronic device includes a heat sink, a substrate mounted on the heat sink, a coating layer formed on the substrate, a lead frame fixed to the heat sink, and a mold resin sealing the substrate and the lead frame. The coating layer is made of one of a polyimide-based resin and a polyamideimide-based resin. The lead frame has a fixing terminal fixed to the heat sink through an adhesive layer. The adhesive layer is made of the same material as the coating layer.

12 Claims, 11 Drawing Sheets

ELECTRONIC DEVICE

CROSS REFERENCE TO RELATED APPLICATION

This application is based on Japanese Patent Application No. 2010-14663 filed on Jan. 26, 2010, the disclosure of which is incorporated herein by reference.

FIELD OF THE INVENTION

The present invention relates to an electronic device and a method of manufacturing the same. More specifically, the present invention relates to an electronic device in which a substrate constituting an electronic circuit is mounted on a heat sink and sealed with a mold resin together with a lead frame fixed to the heat sink.

BACKGROUND OF THE INVENTION

An electronic device in which a substrate constituting an electronic circuit is mounted on a heat sink and sealed with a mold resin together with a lead frame fixed to the heat sink, which is so-called a resin-sealed electronic device, is, for example, described in publication of Japanese Patent No. 3201277, Japanese Patent Application Publication No. 10-56126, and Japanese Patent Application Publication No. 2000-269415.

FIG. 13 shows an example of a manufacturing process of an electronic device. In the example of FIG. 13, a hybrid IC (hereinafter, HIC) substrate in which electronic parts are integrated and mounted on a wiring board is exemplarily employed as the substrate.

In S1 and S2, a silicon-based adhesive is printed on a heat sink. In S3, the HIC substrate on which an electronic circuit has been formed is mounted on the heat sink. In S4, the adhesive is hardened. In S5 and S6, the heat sink and the lead frame are fixed to each other. For example, the heat sink and the lead frame are fixed by such as crimping, welding, using adhesive tape, or the like.

In S7, a coating material made of a polyamide-based resin, which is a precursor of a polyimide-based resin, is deposited on the HIC substrate. The coating material is employed for restricting separation of the HIC substrate and the mold resin by alleviating thermal stress due to thermal expansion difference therebetween. The coating material is deposited along an outer end of the HIC substrate so as to surround bonding electrode pads. Then, the deposited coating material is heated once.

In S8, wire bonding is conducted, thereby to electrically connect the electrode pads and the lead frame. Although not shown in FIG. 13, a coating material having a viscosity lower than that of the coating material used in S7 is deposited over an entire surface of the HIC substrate after the wire bonding of S8, in order to reduce the separation.

In S9, the HIC substrate is sealed with a mold resin by transfer molding such that the heat sink and the lead frame are partly exposed. In S10, connecting portions of the lead frame are cut. In this way, the electronic device in which the substrate and the lead frame are fixed to the heat sink and sealed with the mold resin is manufactured.

In a case of an electronic device having a semiconductor chip or a small circuit board, it is generally known to form a seating for a substrate at a portion of a lead frame and use the seating as a heat sink. On the other hand, in a case of an electronic device having a relatively large substrate, such as the HIC substrate, the heat sink and the lead frame are generally provided as separate parts. Also, the coating material is required to restrict the separation of the substrate and the mold resin.

SUMMARY OF THE INVENTION

According to an aspect of the present invention, an electronic device includes a heat sink, a substrate, a coating layer, a lead frame, an adhesive layer and a mold resin. The substrate constitutes an electronic circuit, and is mounted on the heat sink. The coating layer is formed on the substrate. The coating layer is made of one of a polyimide-based resin and a polyamideimide-based resin. The lead frame has a fixing terminal fixed to the heat sink through the adhesive layer. The adhesive layer is made of the same material as the coating layer. The mold resin seals the substrate and the lead frame.

In the above structure, the coating layer is formed on the substrate to alleviate a thermal stress due to thermal expansion difference between the substrate and the mold resin, thereby to restrict separation between the substrate and the mold resin. The coating layer is made of the polyimide-based resin or the polyamideimide-based resin, which is formed by imidizing a polyamide-based resin. The adhesive layer is made of the same material as the coating layer. The polyimide-based resin and the polyamideimide-based resin have adhesion in accordance with the imidization of the polyamide-based resin. Thus, the lead frame is fixed to the heat sink using the adhesion of the polyimide-based resin or the polyamideimide-based resin.

Since the adhesive layer and the coating layer are formed using the same material, material costs reduce. Accordingly, the manufacturing costs reduce.

For example, the substrate is a HIC substrate having a wiring board and an electronic part integrated and mounted on the wiring board. The HIC substrate is relatively large. Also in this case, even if the lead frame and the heat sink are provided as the separate parts and the coating layer is required, the manufacturing costs reduce and reliability improves.

As another example, the substrate includes a silicon substrate, which is generally smaller than the HIC substrate. In this case, it is configured such that an IC chip is sealed with the mold resin. Also in this case, even if the lead frame and the heat sink are provided as the separate parts and the coating layer is required, the manufacturing costs reduce and reliability improves.

According to a second aspect of the present invention, a method of manufacturing an electronic device includes: mounting a substrate constituting an electronic circuit on a heat sink; applying a precursor of one of a polyimide-based resin and a polyamideimide-based resin to a predetermined portion of the substrate and a predetermined portion of the heat sink; placing a fixing terminal of a lead frame to the predetermined portion of the heat sink; heating the precursor for imidization; and sealing the substrate and the lead frame with a mold resin.

According to the above method, the precursor for forming the coating layer and the precursor for forming an adhesive layer fixing the fixing terminal and the heat sink are applied in a single applying step, and thus are heated in a single heating step. Thus, manufacturing process is simplified. In addition, since the same material is used for the coating layer and the adhesive layer, material costs reduce. Accordingly, manufacturing costs reduce.

According to a third aspect of the present invention, a method of manufacturing an electronic device includes: applying a precursor of one of a polyimide-based resin and a polyamideimide-based resin to a first predetermined portion and a second predetermined portion of a heat sink; placing a substrate constituting an electronic circuit and a fixing portion of a lead frame on the precursor applied to the first predetermined portion and the precursor applied to the second predetermined portion, respectively; heating the precursor on the first and second predetermined portions for imidization; applying a precursor of the one of the polyimide-based resin and the polyamideimide-based resin to the substrate; and sealing the substrate and the lead frame with a mold resin.

According to the above method, the precursor for fixing the substrate and the heat sink and the precursor for fixing the lead frame and the heat sink are applied in a single applying step, and thus are heated in a single heating step. As such, manufacturing process is simplified. Also, the same material is used to form an adhesive layer fixing the substrate and the heat sink, an adhesive layer fixing the lead frame and the heat sink, and the coating layer. Thus, material costs reduce. Accordingly, the manufacturing costs reduce.

BRIEF DESCRIPTION OF THE DRAWINGS

Other objects, features and advantages of the present invention will become more apparent from the following detailed description made with reference to the accompanying drawings, in which like parts are designated by like reference numbers and in which.

DETAILED DESCRIPTION OF EXEMPLARY EMBODIMENT

An embodiment of the present invention is hereinafter described in detail with reference to the drawings.

Figure 1A:
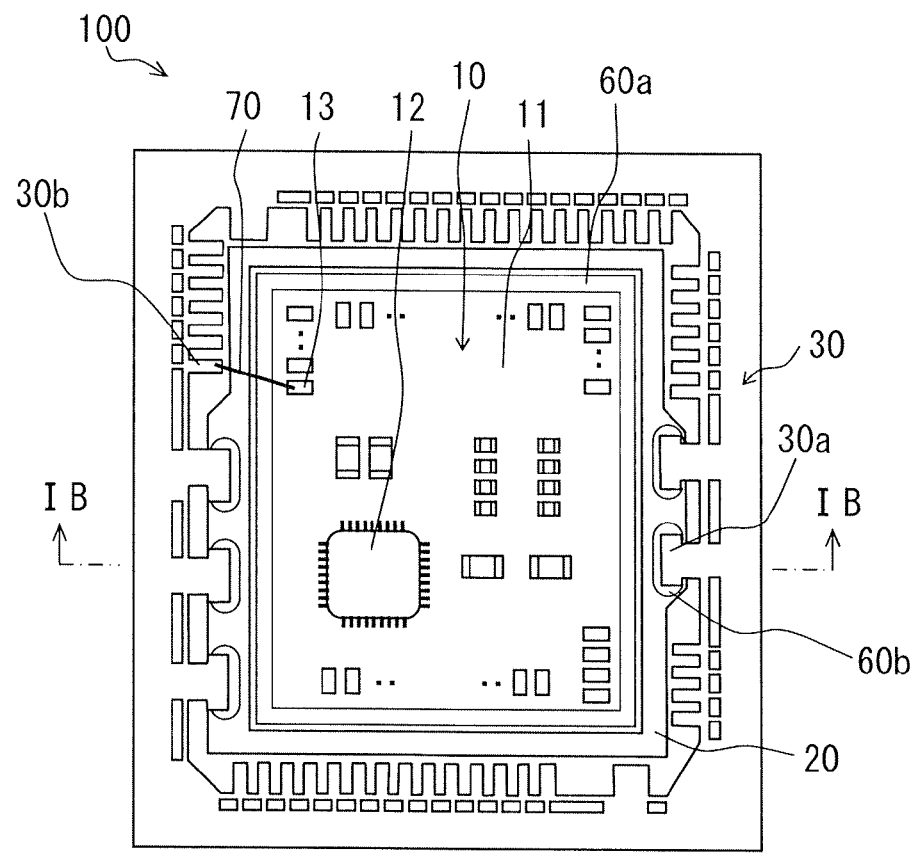
FIG. 1A is a plan view of a electronic device, before being sealed with a mold resin, according to an example of an embodiment of the present invention.
Figure 1B:
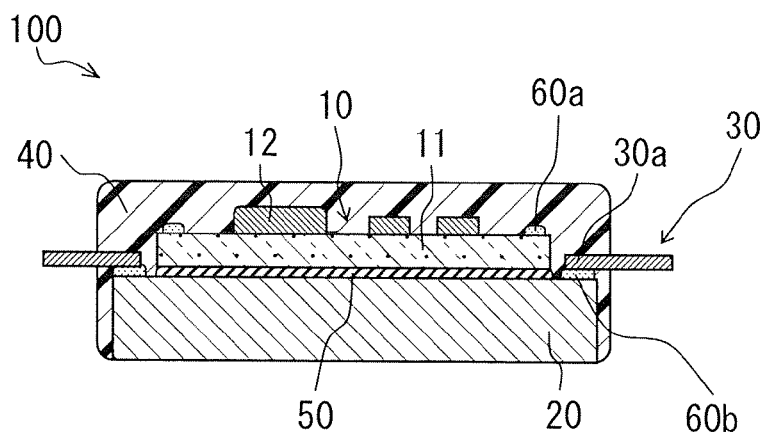
FIG. 1B is a cross-sectional view of the electronic device according to the example of the embodiment.

FIG. 1A is a plan view of an electronic device 100 as an example, before being sealed with a mold resin 40. FIG. 1B is a cross-sectional view of the electronic device 100 after an outer frame of a lead frame 30 is cut. FIG. 1B is the cross-section when taken along a line corresponding to a line IB-IB of FIG. 1A.

Figure 2:
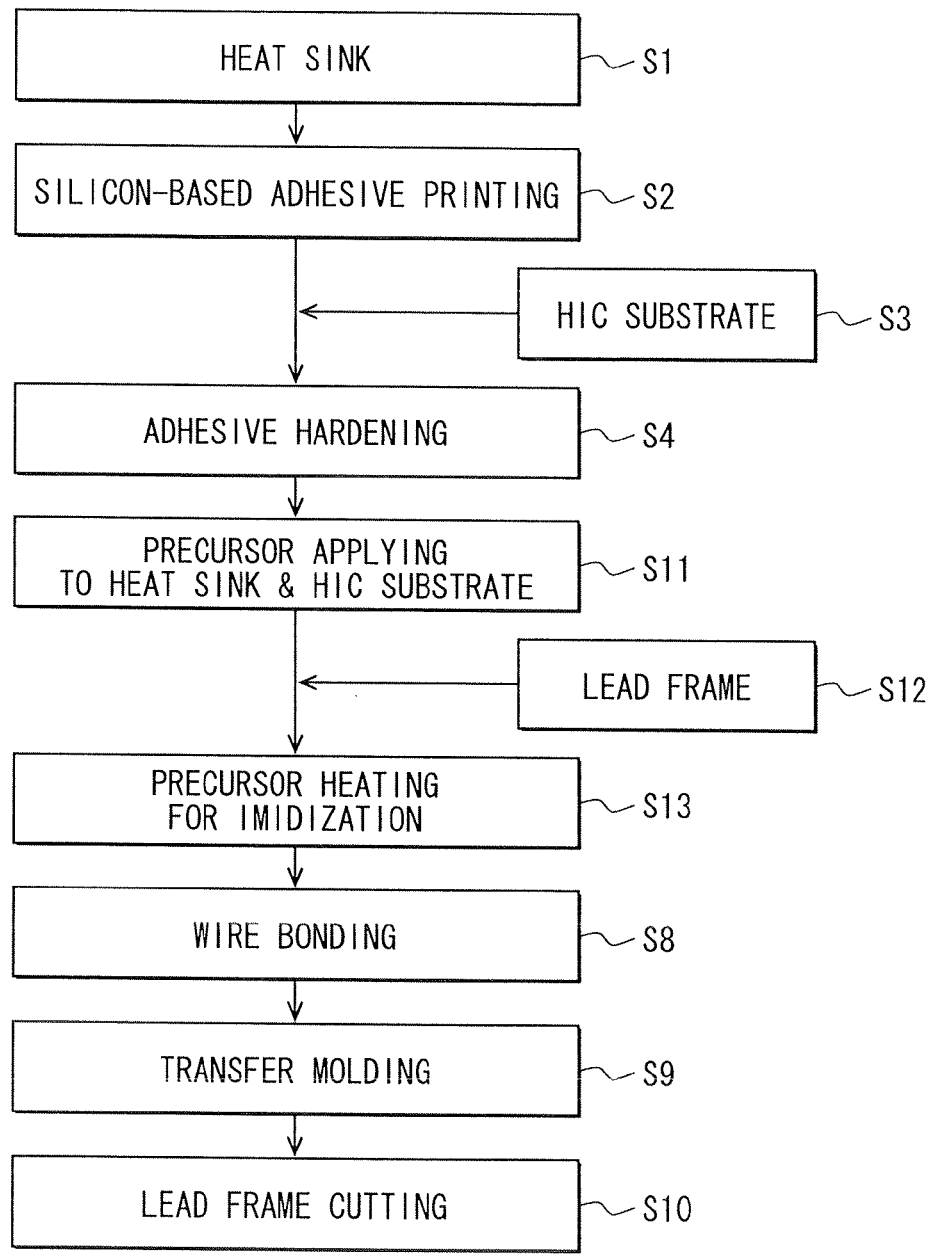
FIG. 2 is a flowchart showing a process of manufacturing the electronic device shown in FIGS. 1A and 1B.
Figure 13:
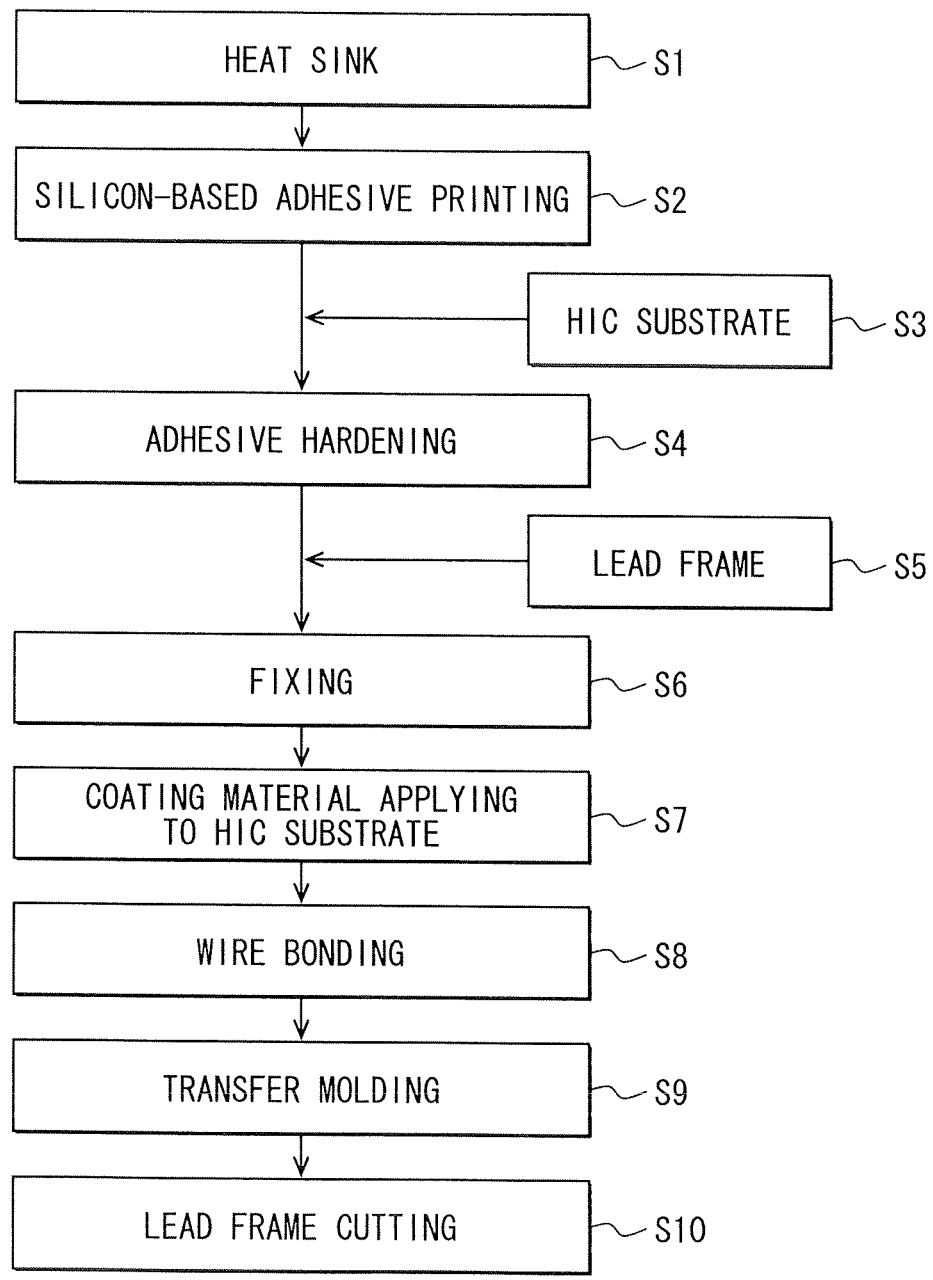
FIG. 13 is a flowchart showing an example of a process of manufacturing an electronic device in which a HIC substrate is resin-sealed as a related art.

FIG. 2 is a flowchart showing a process of manufacturing the electronic device 100 shown in FIGS. 1A and 1B. In FIG. 2, the steps corresponding to the steps of FIG. 13 are denoted by the same reference numbers.

As shown in FIGS. 1A and 1B, the electronic device 100 generally includes a substrate 10 constituting an electronic circuit, a heat sink 20, a lead frame 30 and a mold resin 40. The substrate 10 is mounted on the heat sink 20. The lead frame 30 is fixed to the heat sink 20. The substrate 10 and the lead frame 30 are sealed with the mold resin 40.

For example, the heat sink 20 is made of metal, such as copper. In the electronic device 100, the lead frame 30 is fixed to the heat sink 20 through an adhesive layer 60b. That is, the lead frame 30 is not fixed to the heat sink 20 by welding or crimping. Therefore, the heat sink 20 can be made of a material, which is generally expensive to be machined and not suitable for welding or crimping. For example, the heat sink 20 can be made of silicon carbide (SiC), carbon, a sintered compact of aluminum (Al) and silicon carbide, or the like. As the mold resin 40, for example, an epoxy-based resin is used.

The substrate 10 is a HIC substrate having a wiring board 11 and an electronic part 12 integrated and mounted on the wiring board 11. The wiring board 11 is made of alumina. The substrate 10 is mounted on the heat sink 20 through an adhesive layer 50 made of a silicon-based adhesive.

A coating layer 60a is formed on the substrate 10. For example, the coating layer 60a is formed along an outer end of the substrate 10. The coating layer 60a is made of a polyimide-based resin or a polyamideimide-based resin.

The lead frame 30 has fixing terminals 30a. Each of the fixing terminals 30a is fixed to the heat sink 20 through the adhesive layer 60b. The adhesive layer 60b is made of the polyimide-based resin or the polyamideimide-based resin, which is the same material as the coating layer 60a.

Further, electrode pads 13 for bonding are formed on the wiring board 11. The electrode pads 13 are electrically connected to input/output lead terminals 30b of the lead frame 30 through bonding wires 70.

The heat sink 20 and the lead frame 30 are provided as separate parts. Therefore, the structure is different from a structure in which a seating for the substrate is formed at a portion of a lead frame and is used as a heat sink. In the structure where the heat sink 20 and the lead frame 30 are provided as separate parts, the size and thickness of the heat sink 20 are optional. That is, the heat sink 20, which has a size and thickness suitable for the substrate 10, can be employed. Therefore, the structure is adaptable to a case where the substrate 10 is relatively large, as the HIC substrate.

The heat sink 20 and the lead frame 30 are fixed to each other through the adhesive layer 60b, in place of by crimping, welding or using adhesive tape. The adhesive layer 60b is made of the polyimide-based resin and the polyamideimide-based resin, as the same material of the coating layer 60a.

The coating layer 60a is provided to restrict separation of the mold resin 40 and the substrate 10 by alleviating thermal stress due to thermal expansion difference therebetween. To form the coating layer 60a, a polyamide-based resin as a precursor is applied to the substrate 10 before resin-molding. The applied polyamide-based resin is imidized by heating, and thus becomes the polyimide-based resin or the polyamideimide-based resin.

When the polyamide-based resin is imidized by heating, adhesion is generated. The adhesive layer 60b for fixing the lead frame 30 to the heat sink 20 is made of the same material as the coating layer 60a. That is, the adhesive layer 60b is made by imidizing the polyimide-based resin, similar to the coating layer 60a. The lead frame 30 and the heat sink 20 are fixed using the adhesion caused by the imidization.

Since the adhesive layer 60b for fixing the heat sink 20 and the lead frame 30 is made of the same material as the coating layer 60a formed on the substrate 10, material costs reduce. The coating layer 60a and the adhesive layer 60b are formed by applying the polyamide-based resin as the precursor in the same applying step and heating the applied polyamide-based resin in the same heating step. As such, manufacturing costs reduce.

Accordingly, in the above-described electronic device 100, even if the substrate 10 is large as the HIC substrate, reliability improves and manufacturing costs reduce.

In general, the HIC substrate is relatively large. Thus, in the electronic device having the HIC substrate, the heat sink and the lead frame are generally provided as separate parts. Also, the coating layer for restricting the separation by alleviating the thermal stress due to the thermal expansion different between the substrate and the mold resin is generally required. Therefore, the above structure is suitably employed to the electronic device having the HIC substrate. Further, the above structure can be also employed to an electronic device having a silicon substrate, which will be described later.

Next, a process of manufacturing the electronic device shown in FIGS. 1A and 1B will be described with reference to FIG. 2.

Firstly, the substrate 10 is mounted on the heat sink 20. Specifically, in S1, the heat sink 20 is arranged. In S2, the silicon-based adhesive 50 is printed on a predetermined portion of the heat sink 20 where the wiring board 11 is attached. In S3, the HIC substrate 10 on which the electronic circuit has been formed is laid on the predetermined portion of the heat sink 20. In S4, the adhesive is hardened. S1 through S4 of FIG. 2 are performed in similar manner to S1 through S4 of FIG. 13.

Next, in S11, the precursor is applied. Specifically, the polyamide-based resin, which is the precursor of the polyimide-based resin or the polyamideimide-based resin, is applied to predetermined portions of the wiring board 11 and the heat sink 20 where the coating layer 60a and the adhesive layer 60b are to be formed.

In S12, the lead frame 30, which has been prepared, is placed on the predetermined portion of the heat sink 20 where the precursor has been applied. In S13, the applied precursor is heated for imidization. During the imidization, adhesion is provided. Therefore, the heated precursor becomes the adhesive layer 60b, and thus the fixing terminals 30a of the lead frame 30 are fixed to the heat sink 20. Simultaneously, the precursor, which has been applied to the substrate 10, is hardened, and thus becomes the coating layer 60a.

Then, in S8, wire bonding is conducted to electrically connect the electrode pads 13 and the input/output lead terminals 30b of the lead frame 30 through the bonding wires 70.

In S9, resin-molding is conducted. Specifically, the substrate 10 mounted on the heat sink 20 and the lead frame 30 fixed to the heat sink 20 are sealed with the mold resin 40 such that the heat sink 20 and the lead frame 30 are partly exposed, by transfer molding. In S10, connecting portions of the lead frame 30 are cut.

In FIG. 2, S8 through S10 are performed in similar manner to S8 through S10 of FIG. 13. In this way, the electronic device 100 is manufactured.

In the above-described process, the precursor for the coating layer 60a and the precursor for the adhesive layer 60b are the same material, and are applied in the single applying step and heated in the single heating step. Therefore, the material costs reduce, and the manufacturing process is simplified. As such, the manufacturing costs reduce.

Figure 3:
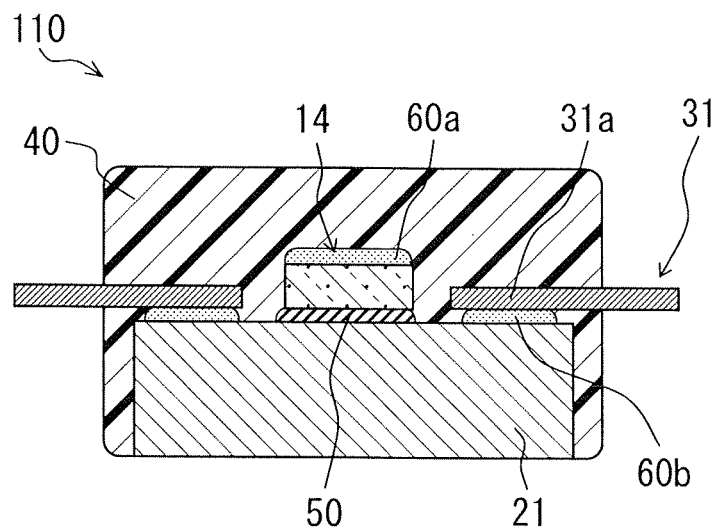
FIG. 3 is a cross-sectional view of an electronic device according to another example of the embodiment.

FIG. 3 shows an electronic device 110 as another example of the embodiment. In FIG. 3, like parts are denoted with like reference numbers.

In the electronic device 100 of FIGS. 1A and 1B, the substrate 10 is the HIC substrate constructed of the wiring board 11 and the electronic part 12 integrated and mounted on the wiring board 11. On the other hand, the electronic device 110 has a substrate 14 constructed of a silicon substrate constituting an electronic circuit. In the electronic device 110, therefore, it is configured such that an IC chip is sealed with the mold resin 40.

As shown in FIG. 3, the substrate 14 is directly attached to a heat sink 21 through the adhesive layer 50. Similar to the electronic device 100 of FIGS. 1A and 1B, fixing terminals 31a of a lead frame 31 are fixed to the heat sink 21 through the adhesive layer 60b, which is made of the polyimide-based resin or the polyamideimide-based resin. That is, also in the electronic device 110 of FIG. 3, the coating layer 60a and the adhesive layer 60b are made of the same material as the coating layer 60a formed on the substrate 14. As such, the material costs reduce and the manufacturing process is simplified.

Figure 4:
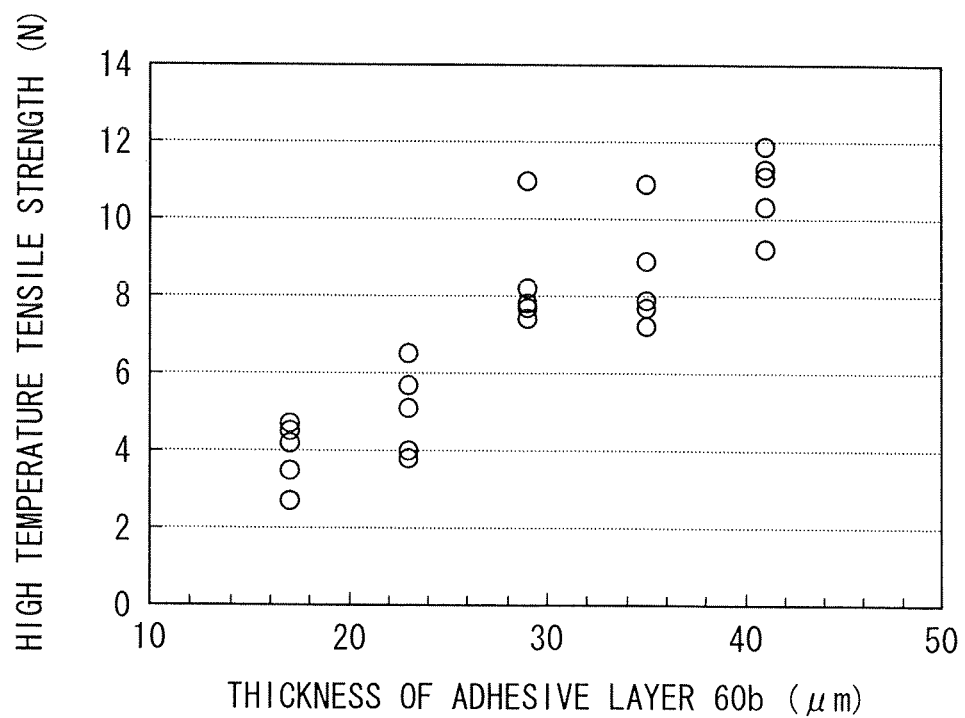
FIG. 4 is a graph showing a relationship between a thickness of an adhesive layer and high temperature tensile strength according to the embodiment.

FIG. 4 shows a relationship between a thickness of the adhesive layer 60b and high temperature tensile strength. The adhesive layers 60b made of the polyimide-based resin having different thicknesses are formed by varying the viscosity of the precursor. The tensile strength of the adhesive layers 60b under high temperature is evaluated. As shown in FIG. 4, the tensile strength of the adhesive layer 60b increases with an increase in the thickness. The tensile strength gradually reaches a plateau from approximately 30 micrometers.

Therefore, the thickness of the adhesive layer 60b of the electronic devices 100, 110 is, for example, at least 17 micrometers and at most 41 micrometers. In a case where the thickness of the adhesive layer 60b is less than 17 micrometers, adhesive strength is insufficient, causing separation easily. In a case where the thickness of the adhesive layer 60b is more than 41 micrometers, the adhesive strength is plateau.

Further, the thickness of the adhesive layer 60b can be at least 29 micrometers and at most 41 micrometers. In this case, the adhesive strength is stably achieved.

Figure 5:
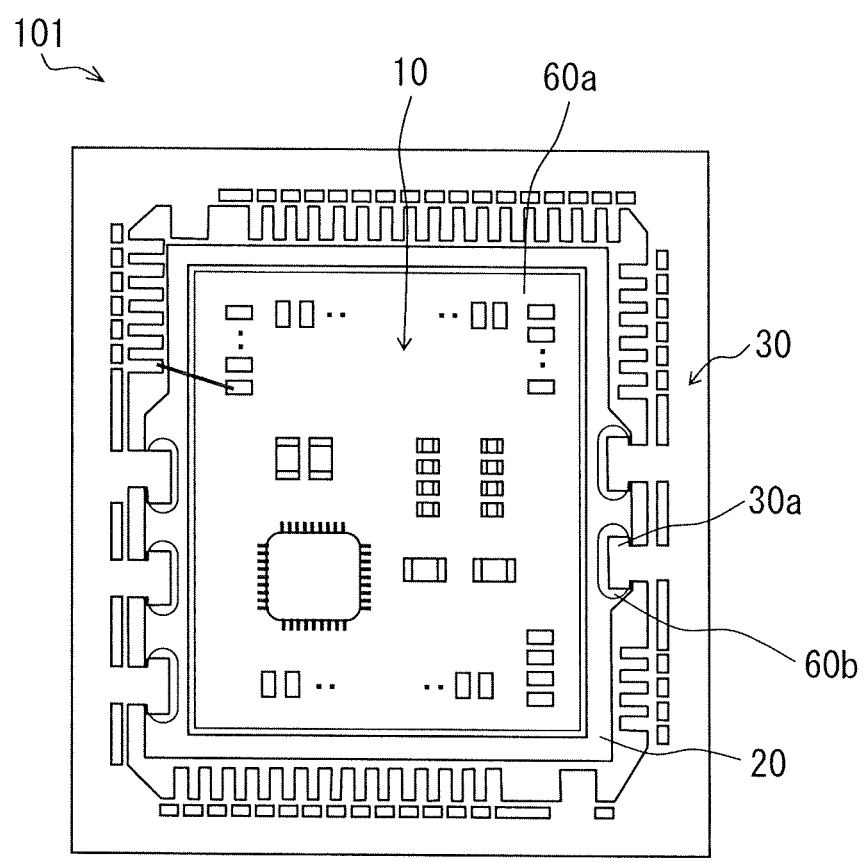
FIG. 5 is a plan view of an electronic device, before being sealed with a mold resin, according to a first modification of the embodiment.
Figure 6:
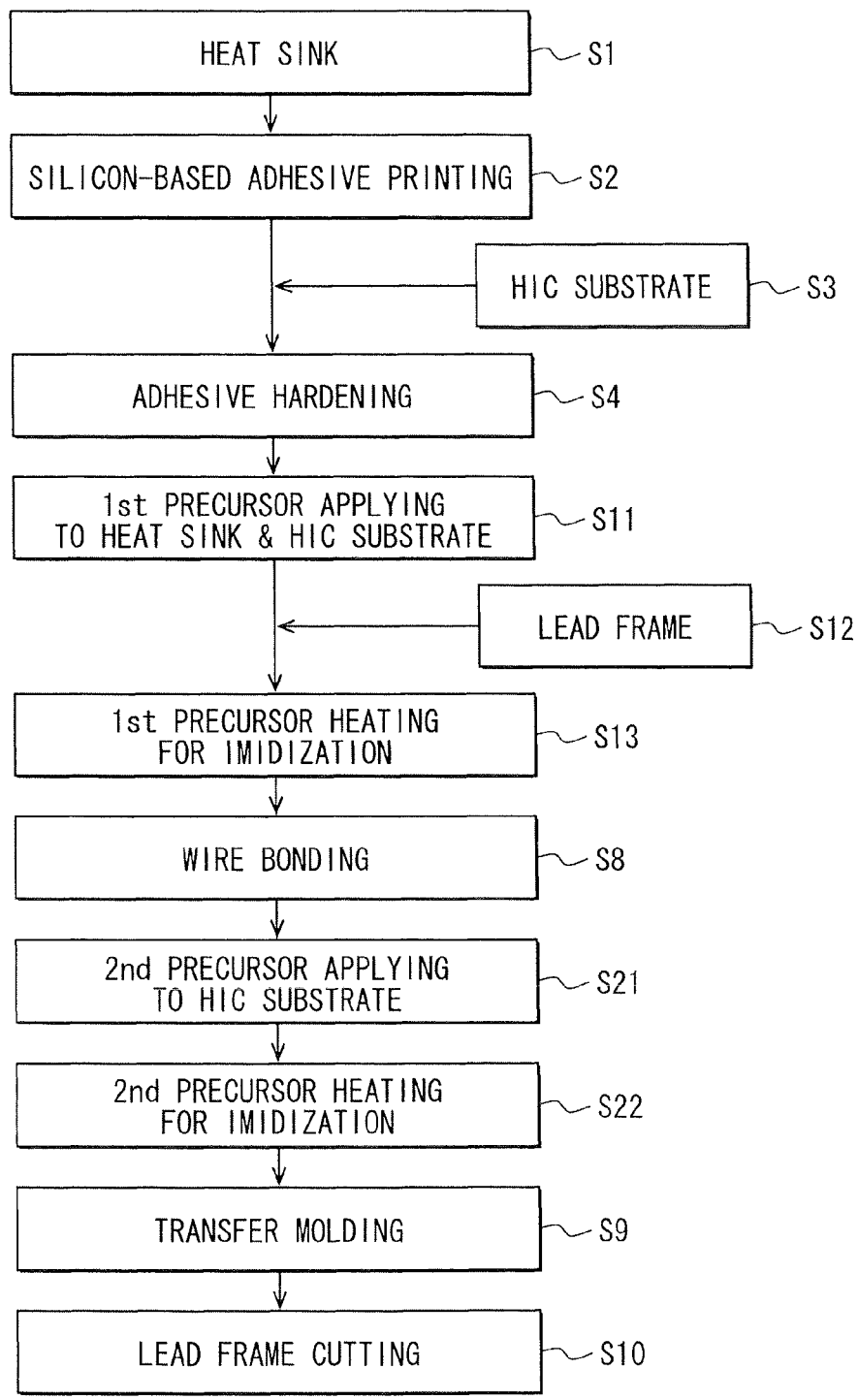
FIG. 6 is a flowchart for showing a process of manufacturing the electronic device shown in FIG. 5.

FIG. 5 shows an electronic device 101, before being sealed with the mold resin 40, as a first modification of the electronic device 100 shown in FIGS. 1A and 1B. FIG. 6 shows a process of manufacturing the electronic device 101 shown in FIG. 5.

In the electronic device 100 of FIGS. 1A and 1B, the coating layer 60a is formed along the outer end of the substrate 10. In the electronic device 101, on the other hand, the coating layer 60a is formed over an entire surface of the substrate 10.

Because the thermal stress due to the thermal expansion difference between the mold resin 40 and the substrate 10 is the maximum at the outer end of the substrate 10, the separation easily occurs at the outer end of the substrate 10.

Therefore, it is effective to form the coating layer 60a along the outer end of the substrate 10 as shown in FIG. 1.

Further, in the case where the coating layer 60a is formed over the entire surface of the substrate 10, the separation is more effectively reduced.

The electronic device 101 is manufactured in accordance with a process shown in FIG. 6. The process of FIG. 6 is different from the process of FIG. 2 because a second precursor applying step S21 and a second precursor heating step S22 are added after the wire bonding of S8.

In the process of FIG. 6, S1, S2, S3, S4 are performed in the similar manner as S1, S2, S3, S4 of FIG. 2. In S11 of FIG. 6, the polyamide-based resin as the precursor of the polyimide-based resin or the polyamideimide-based resin is applied to the outer end of the substrate 10 and the portions of the heat sink 20 to which the fixing terminals 30a are fixed, as a first precursor.

In S12, the lead frame 30 is placed on the predetermined portion of the heat sink 20. In S13, the first precursor is heated. As such, the first precursor is imidized, and the lead frame 30 is fixed to the heat sink 20. Next, in S8, the wire bonding is conducted to electrically connect the electrode pads 13 and the input/output lead terminals 30b of the lead frame 30.

Thereafter, the second precursor applying step and the second precursor heating step are performed in S21, S22. Specifically, in S21, a precursor, which is a precursor of a polyimide-based resin or a polyamideimide-based resin, but has a viscosity lower than that of the first precursor, is applied as a second precursor to the entire surface of the substrate 10. In S22, the applied second precursor is heated for imidization.

Then, in S9, the substrate 10 and the lead frame 30 are sealed with the mold resin 40 by transfer molding. In S10, connecting portions of the lead frame 30 are cut. In this way, the electronic device 101 of FIG. 5 is manufactured.

In the electronic device 101, the coating layer 60a is formed over the entire surface of the substrate 10 so as to more effectively reduce the separation. In this case, the first precursor is applied to the outer end of the substrate 10 at the same time as applying the first precursor to the portions of the heat sink 20 to which the fixing terminals 30a are fixed. The first precursor is heated once to fix the lead frame 30 to the heat sink 20. Further, after the wire bonding, the second precursor having the lower viscosity is applied to the entire surface of the substrate 10. Also in this case, the first precursor for forming the coating layer 60a and the first precursor for forming the adhesive layer 60b are applied in the same applying step and heated in the same heating step. Accordingly, the manufacturing costs reduce.

Figure 7:
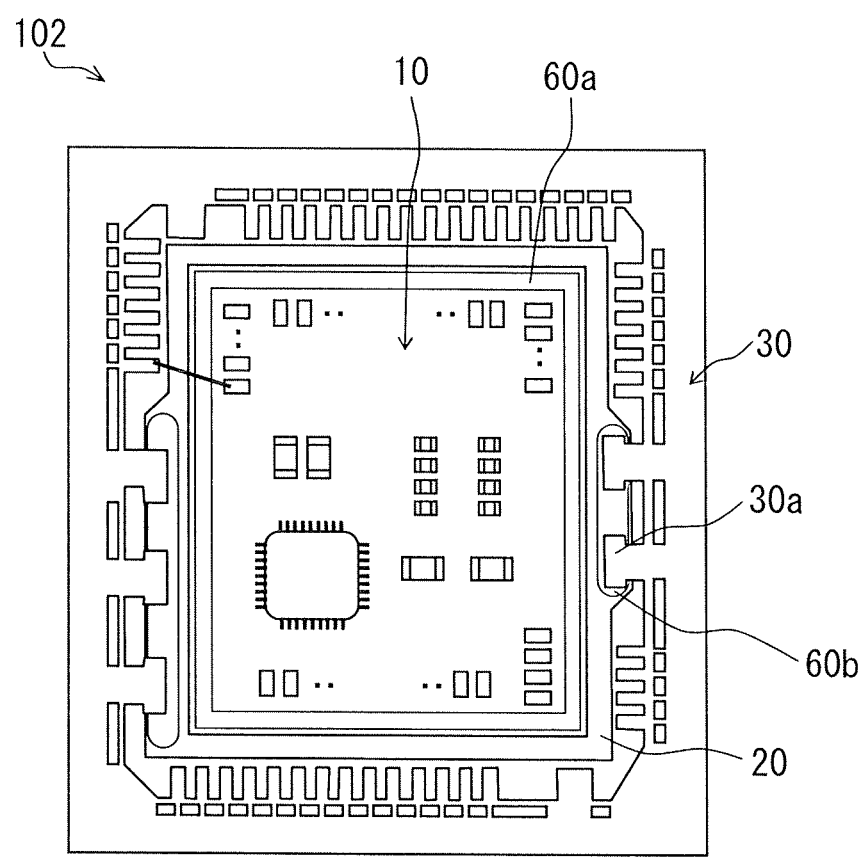
FIG. 7 is a plan view of an electronic device, before being sealed with a mold resin, according to a second modification of the embodiment.

FIG. 7 shows an electronic device 102, before being sealed with the mold resin 40, as a second modification of the electronic device 100.

In the electronic device 100 of FIGS. 1A and 1B, the adhesive layer 60b, which is made of the polyimide-based resin or the polyamideimide-based resin, is formed for each of the fixing terminals 30a of the lead frame 30. In the electronic device 102 of FIG. 7, on the other hand, the adhesive layer 60b is formed over multiple fixing terminals 30a of the lead frame 30.

In this case, the precursor for forming the adhesive layer 60b is easily applied, as compared with the case of FIGS. 1A and 1B. In a case where the heat sink 20 is pressed by a mold during resin-sealing, however, if the adhesive layer 60b is formed separately for each of the fixing terminals 30a as the electronic device 100, interference with a molding press is easily reduced.

Figure 8A:
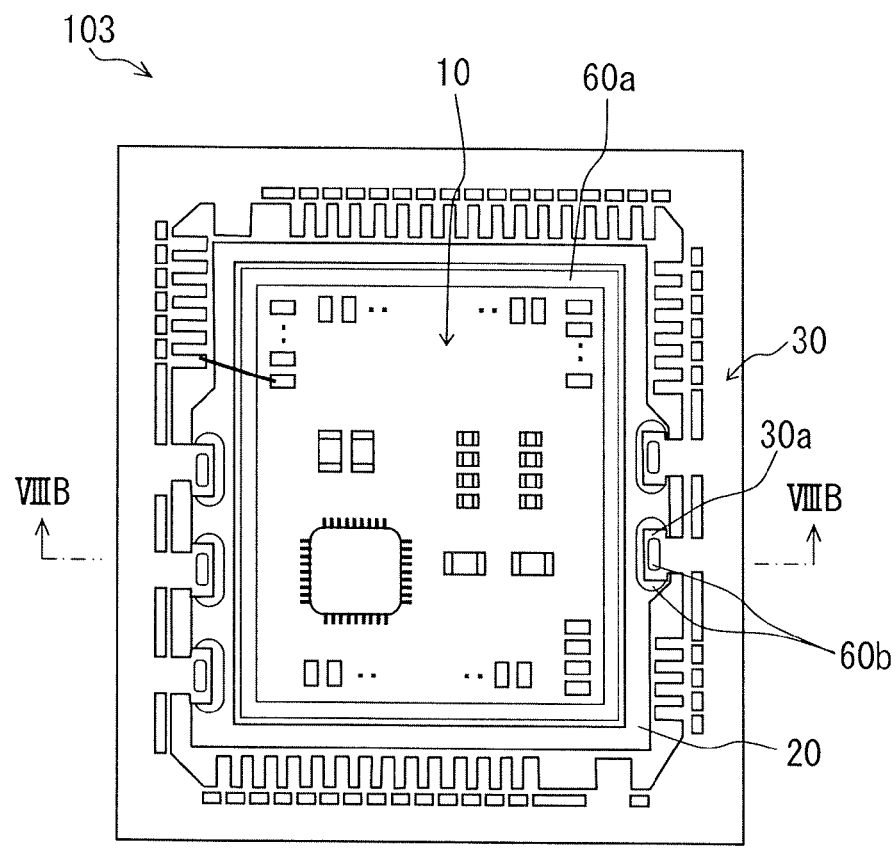
FIG. 8A is a plan view of an electronic device, before being sealed with a mold resin, according a third modification of the embodiment.
Figure 8B:
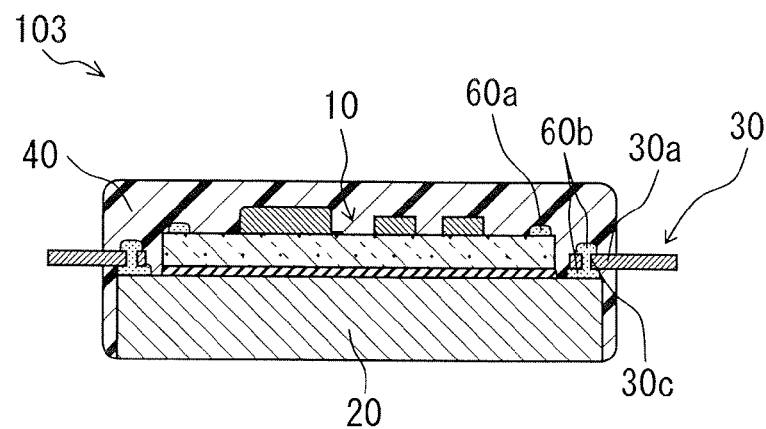
FIG. 8B is a cross-sectional view of the electronic device according to the third modification.

FIG. 8A shows an electronic device 103, before being sealed with the mold resin 40, as a third modification of the electronic device 100. FIG. 8B shows a cross-section of the electronic device 103 after the outer frame of the lead frame 30 is cut. FIG. 8B is the cross-section when the electronic device 103 is taken along a line corresponding to a line VIIIB-VIIIB in FIG. 8A.

In the electronic device 100 of FIGS. 1A and 1B, the adhesive layer 60b is disposed between the fixing terminal 30a and the heat sink 20 to fix the fixing terminal 30a and the heat sink 20. In the electronic device 103, the fixing terminal 30a is formed with a through hole 30c. The adhesive layer 60b is formed to pass through the through hole 30c and cover a periphery of the through hole 30c on a side opposite to the heat sink 20. That is, the adhesive layer 60b is formed to cover an upper surface of the lead frame 30 on a periphery of the through hole 30c while passing through the through hole 30c. Thus, the adhesive layer 60b exists between the fixing terminal 30a and the heat sink 20, within the through hole 30c, and on the upper surface of the lead frame 30 on the periphery of the through hole 30c.

To form the adhesive layer 60b, the polyamide-based resin as the precursor of the polyimide-based resin or the polyamideimide-based resin is applied to the heat sink 20, and then the fixing terminal 30a is pressed against the applied precursor. As a result, the precursor is forced to the upper surface of the fixing terminal 30a through the through hole 30c. Since the adhesive layer 60b covers the upper surface of the fixing terminal 30a, the fixing of the lead frame 30 to the heat sink 20 improves, as compared with the electronic device 100 without having the through hole 30c.

Figure 9:
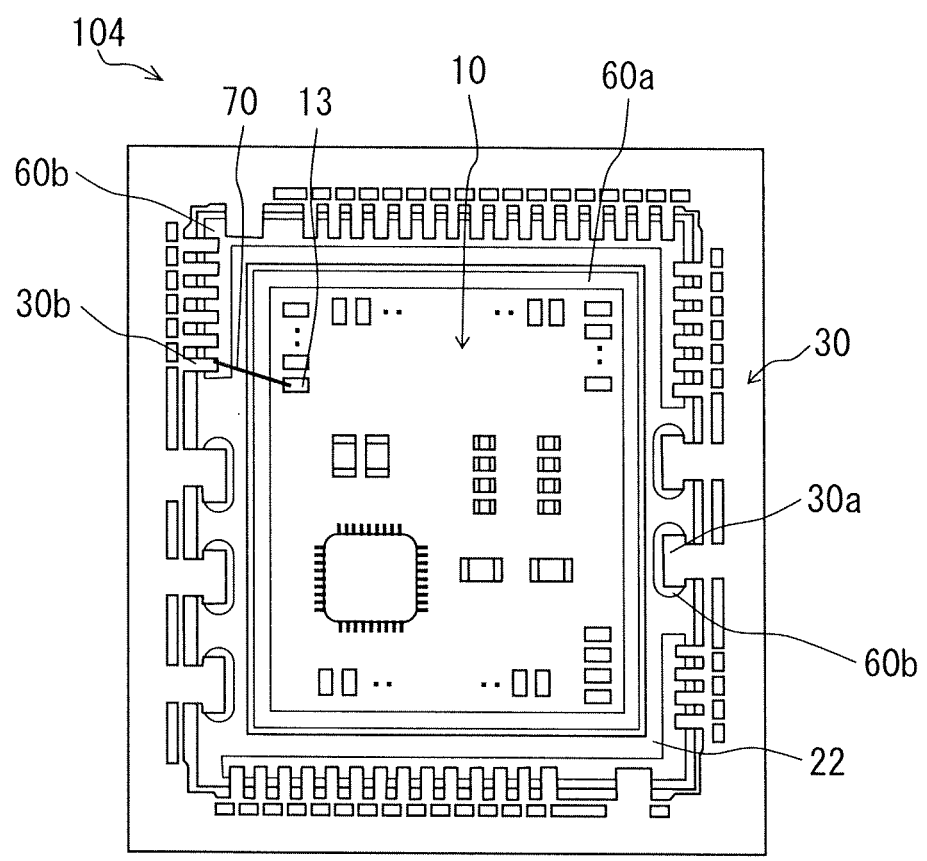
FIG. 9 is a plan view of an electronic device, before being sealed with a mold resin, according to a fourth modification of the embodiment.

FIG. 9 shows an electronic device 104, before being sealed with the mold resin 40, as a fourth modification of the electronic device 100.

In the electronic device 100 of FIGS. 1A and 1B, the adhesive layer 60b is formed to fix the fixing terminals 30a of the lead frame 30 to the heat sink 20. In the electronic device 104 of FIG. 9, in addition to the fixing terminals 30a, the input/output lead terminals 30b of the lead frame 30 are adhered to a heat sink 22 by the adhesive layer 60b.

That is, the adhesive layer 60b for fixing the input/output lead terminals 30b to the heat sink 22 is made of the same material as the adhesive layer 60b for fixing the fixing terminals 30a to the heat sink 22. The adhesive layer 60b has electrical insulation. Thus, by fixing the input/output lead terminals 30b to the heat sink 22 by the adhesive layer 60b, fixing strength of the input/output lead terminals 30b to the heat sink 22 improves while maintaining electrical insulation therebetween. Further, heat radiation from the input/output lead terminals 30b improves.

Figure 10:
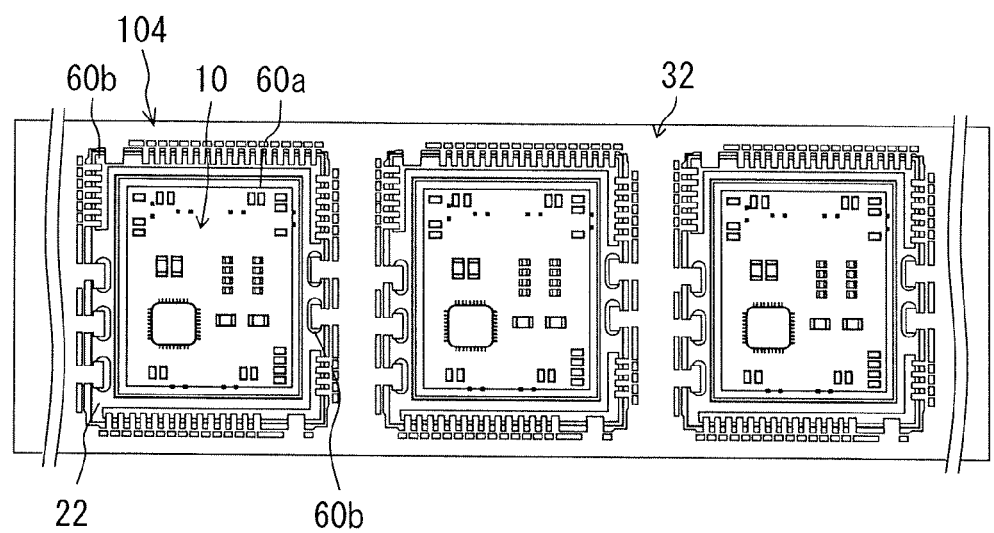
FIG. 10 is a plan view showing an example where the electronic device shown in FIG. 9 is manufactured using a continuous lead frame.

FIG. 10 shows an example where the electronic device 104 of FIG. 9 is manufactured using a continuous lead frame 32. The electronic devices 101 through 104 can be manufactured using the single lead frame 30, but can be manufactured using the continuous lead frame 32, as shown in FIG. 10.

In the example of FIG. 10, the lead frame 32 is continuous over the multiple electronic devices 104 in the right and left direction. However, the lead frame 32 can be continuous in the up and down direction, or in both the right and left direction and the up and down direction.

Figure 11:
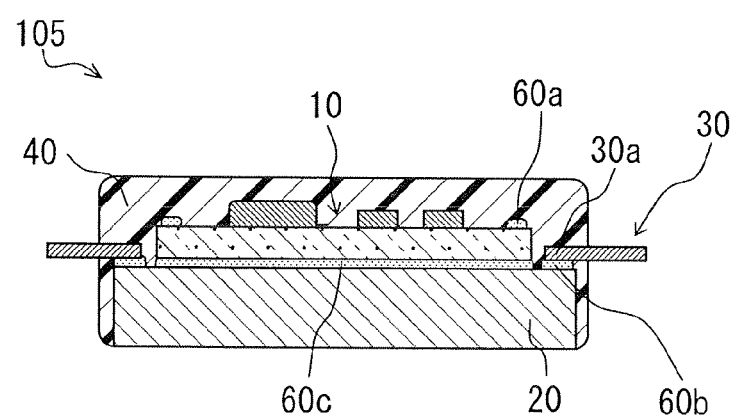
FIG. 11 is a cross-sectional view of an electronic device according to a fifth modification of the embodiment.
Figure 12:
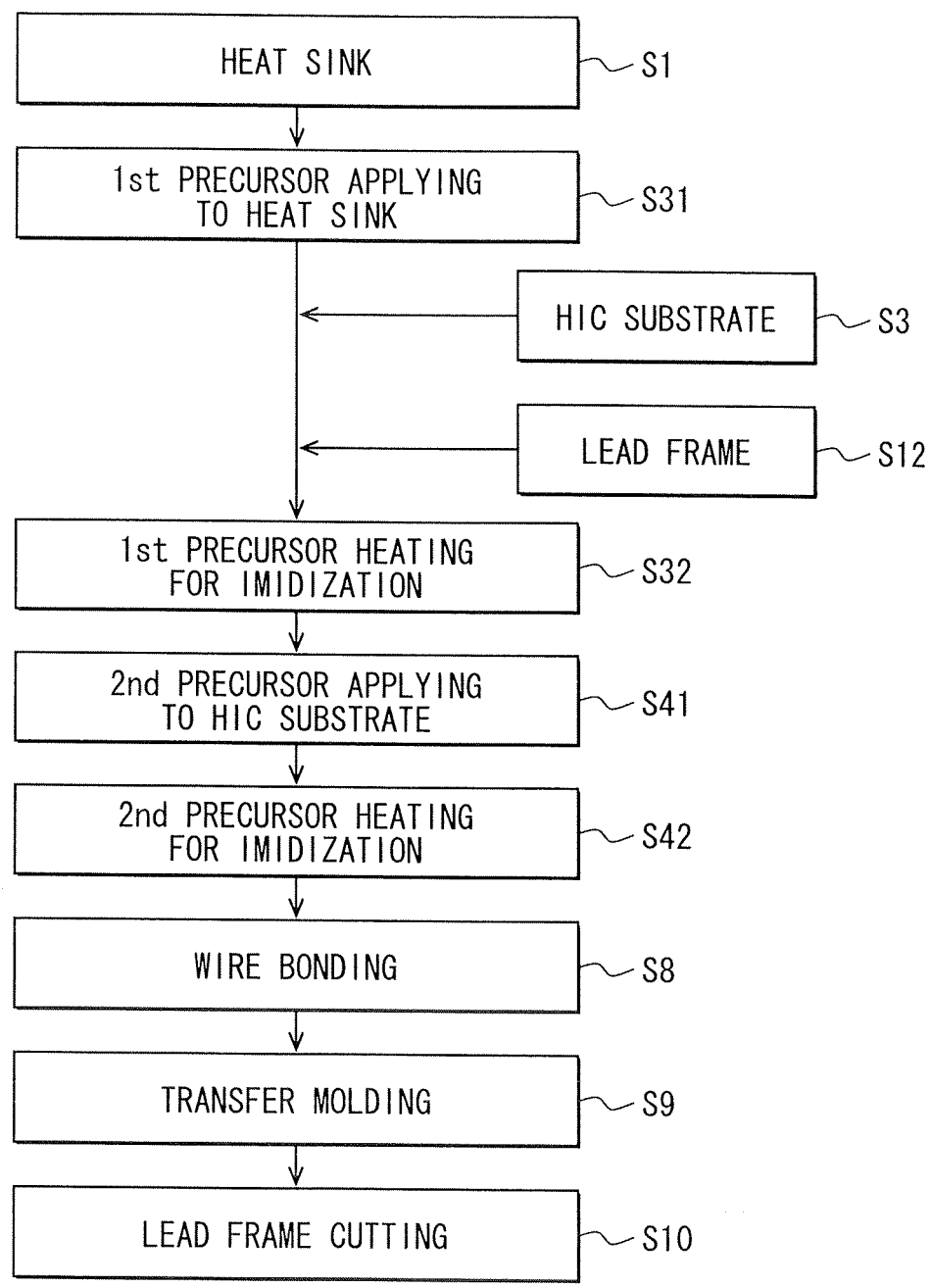
FIG. 12 is a flowchart showing a process of manufacturing the electronic device shown in FIG. 11.

FIG. 11 shows an electronic device 105 after the outer frame of the lead frame 30 is cut, as a fifth modification of the electronic device 100. FIG. 12 shows a process of manufacturing the electronic device 105 of FIG. 11.

In the electronic device 100 of FIG. 1, the adhesive layer 50 made of the silicon-based adhesive is used for fixing the substrate 10 to the heat sink 20. In the electronic device 105 of FIG. 11, the substrate 10 is fixed to the heat sink 20 through an adhesive layer 60c made of the polyimide-based resin or the polyamideimide-based resin, which is the same material as the coating layer 60a.

In general, the silicon-based adhesive has excellent heat conductivity and is easily printed. Thus, the silicon-based adhesive layer is generally used to fix the substrate to the heat sink, as in the electronic device 100. In a case where the amount of heat generated from the substrate 10 is small and it is not necessary to seriously concern about heat conductivity, the adhesive layer 60c made of the polyimide-based resin or the polyamideimide-based resin, which is the same as the coating layer 60a, can be employed for fixing the substrate 10 to the heat sink 20. In such a case, the manufacturing costs further reduce.

The electronic device 105 is manufactured by the process shown in FIG. 12. As shown in FIG. 12, after the heat sink 20 is arranged in S1, the precursor is applied in S31. Specifically, in S31, the polyimide-based resin as the precursor of the polyimide-based resin or the polyamideimide-based resin is applied to predetermined portions of the heat sink 20 to which the substrate 10 and the fixing terminals 30a are to be fixed, as a first precursor.

Next, in S3 and S12, the substrate 10 and the fixing terminals 30a are placed on the applied first precursor of the heat sink 20. In S32, the first precursor is imidized by heating. In this way, the substrate 10 and the fixing terminals 30a are fixed to the heat sink 20.

In S41, the precursor of the polyimide-based resin or the polyamideimide-based resin, as a second precursor, is applied to the predetermined portion of the substrate 10 where the coating layer 60a is to be formed. In this case, the second precursor is the same material as the first precursor. In S42, the second precursor applied on the substrate 10 is imidized by heating.

In S8, the wire bonding is conducted. In S9, the substrate 10 and the lead frame 30 are sealed with the mold resin 40 by transfer molding. In S10, the lead frame 30 is cut. S8, S9 and S10 are performed in similar manners to S8, S9 and S10 of FIG. 2. In this way, the electronic device 105 is manufactured.

As-described in the above, the polyimide-based resin or the polyamideimide-based resin can be employed as the adhesive layer 60c for fixing the substrate 10 to the heat sink 20. In this case, the precursor of the polyimide-based resin or the polyamideimide-based resin is applied to the predetermined portions of the heat sink 20 as the first precursor and is heated once, so the substrate 10 and the fixing terminals 30a of the lead frame 30 are fixed to the heat sink 20. Then, the precursor is further applied to the predetermined portion of the substrate 10 as the second precursor to form the coating layer 60a. Also in this case, the precursor for forming the adhesive layers 60b, 60c is applied in the same applying step, and thus heated in the same heating step. As such, the manufacturing costs reduce.

According to the above-described structures and producing methods of the electronic devices 100, 110, 101, 102, 103, 104, 105, reliability is ensured and the manufacturing costs are reduced.

The present invention can be implemented by combining the above examples and modifications in various ways. Additional advantages and modifications will readily occur to those skilled in the art. The invention in its broader term is therefore not limited to the specific details, representative apparatus, and illustrative examples shown and described.

What is claimed is:

1. An electronic device comprising:
   a heat sink;
   a substrate constituting an electronic circuit, the substrate being mounted on the heat sink;
   a coating layer disposed on the substrate, the coating layer being made of one of a polyimide-based resin and a polyamideimide-based resin;
   a lead frame having a fixing terminal;
   an adhesive layer fixing the fixing terminal to the heat sink, the adhesive layer being made of the same material as the coating layer; and
   a mold resin sealing the substrate and the lead frame,
   the substrate being a hybrid IC substrate having a wiring board and an electronic part integrated with and mounted on the wiring board,
   the coating layer being disposed on a surface of the substrate opposite to the heat sink, and
   the mold resin being disposed directly on a top and side surfaces of the coating layer and completely surrounding the top and side surfaces of the coating layer.

2. The electronic device according to claim 1, wherein the wiring board is made of alumina.

3. The electronic device according to claim 1, wherein the substrate includes a silicon substrate.

4. The electronic device according to claim 1, wherein the adhesive layer has a thickness of at least 17 micrometers and at most 41 micrometers.

5. The electronic device according to claim 4, wherein the thickness of the adhesive layer is at least 29 micrometers and at most 41 micrometers.

6. The electronic device according to claim 1, wherein the coating layer is disposed at least on an outer end of the substrate.

7. The electronic device according to claim 6, wherein the coating layer is disposed over an entire surface of the substrate.

8. The electronic device according to claim 1, wherein the fixing terminal defines a through hole, and
the adhesive layer is disposed to pass through the through hole and cover a periphery of the through hole on a surface of the fixing terminal, the surface being opposite to the heat sink.

9. The electronic device according to claim 1, wherein the lead frame has an input/output lead terminal, and
the input/output lead terminal is fixed to the heat sink through an adhesive layer made of the one of the polyimide-based resin and the polyamideimide-based resin.

10. The electronic device according to claim 1, wherein the substrate is fixed to the heat sink through another adhesive layer made of the same material as the coating layer.

11. The electronic device according to claim 1, wherein the lead frame has a plurality of fixing terminals including the fixing terminal, and
the adhesive layer is disposed over the plurality of fixing terminals.

12. The electronic device according to claim 1, wherein the coating layer is disposed on a portion of the surface of the substrate on which the electronic part is not mounted.

* * * * *